United States Patent [19]

Katayama

[11] Patent Number: 5,625,589
[45] Date of Patent: Apr. 29, 1997

[54] STATIC MEMORY CELL WITH SPACED APART CONDUCTING LAYERS

[75] Inventor: Yasunao Katayama, Sagamihara, Japan

[73] Assignee: International Business Machines Corporation, Armonk, N.Y.

[21] Appl. No.: 605,564

[22] Filed: Feb. 22, 1996

[30] Foreign Application Priority Data

Feb. 22, 1995 [JP] Japan .................................... 7-033998

[51] Int. Cl.$^6$ .................................................. G11C 11/34
[52] U.S. Cl. .......................... 365/182; 365/160; 365/161; 257/295
[58] Field of Search ........................... 365/160, 161, 365/182; 257/295; 427/123

[56] References Cited

U.S. PATENT DOCUMENTS

| | | | |
|---|---|---|---|
| 5,251,170 | 10/1993 | Daughton et al. | 365/158 |
| 5,323,344 | 6/1994 | Katayama et al. | 365/162 |
| 5,420,819 | 5/1995 | Pohm | 365/158 |

OTHER PUBLICATIONS

Y. Kayama and D. C. Tsui, "Lumped circuit model of two-dimensional to two-dimensional tunneling transistors", Appl. Phys. Lett. 62, 2563 (1993).

*Primary Examiner*—David C. Nelms
*Assistant Examiner*—Son T. Dinh
*Attorney, Agent, or Firm*—Robert M. Trepp

[57] ABSTRACT

A memory cell comprises at least three conducting layers (20) spaced apart by insulating layers (10), a first voltage application means (24) for applying a predetermined voltage between first and third conducting layers (20a, 20c) of the at least three conducting layers, no tunneling current flowing directly between the first and third conducting layers, and a second voltage application means (5) connected to a second conducting layer (20b) of at least three conducting layers, a tunneling current being able to flow between the first and second conducting layers and between the second and third conducting layers. Within these conducting layers (20), quantum-mechanical confinement of free electrons has been made.

14 Claims, 11 Drawing Sheets

STATIC MEMORY CELL WITH SPACED APART CONDUCTING LAYERS

FIELD OF THE INVENTION

The present invention relates to the structure of a static memory cell, and more particularly to a novel structure for storing information by the use of the quantum mechanical property of free electrons.

BACKGROUND OF THE INVENTION

Static memory cells do not require a refresh operation, so they have low power dissipation as compared with dynamic random access memories (DRAMs). The refresh operation is an operation of charging and discharging the capacitance of a DRAM for storing a "0" or "1" as bit information. Such an operation is needed because the capacitance of the DRAM always leaks the stored electric charges from the junction portions, insulating films, and depletion layers.

Figure 1:
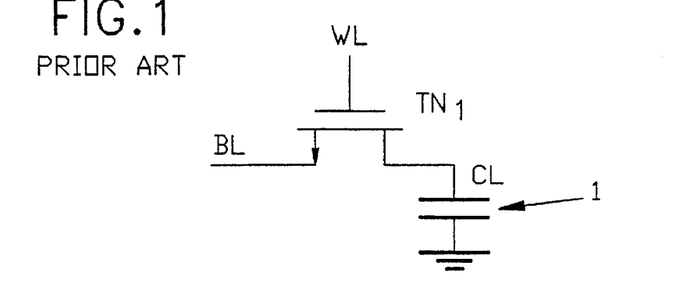
FIG. 1 is a diagram showing the structure of a conventional DRAM.
Figure 2:
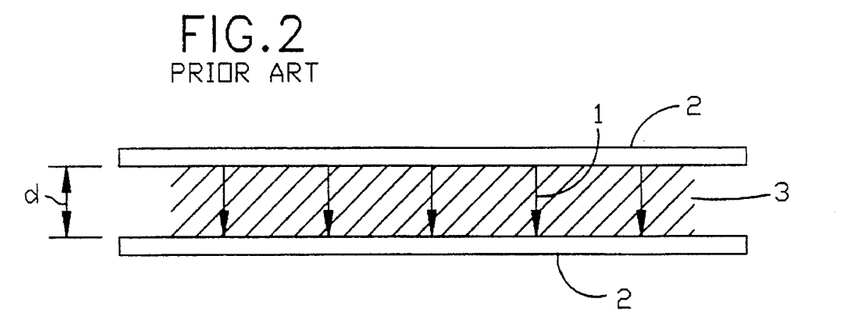
FIG. 2 is a diagram showing the structure of the capacitance of the conventional DRAM.

FIG. 1 shows the structure of a DRAM. Data is stored in a capacitance 1, the structure of which is shown in FIG. 2. That is, an insulating film 3 is interposed between electrodes 2. Since the miniaturization of memories has recently been required, the distance d between the electrodes 2 has to be made smaller. If the distance is made smaller, the thickness of the insulating film 3 will be reduced and the leakage current i between the electrodes will increase. Such an increase in the leakage current means that a refresh operation must be more frequently performed. Therefore, as memories are made smaller, the DRAM has the disadvantage that its refresh operation becomes complicated.

Figure 3:
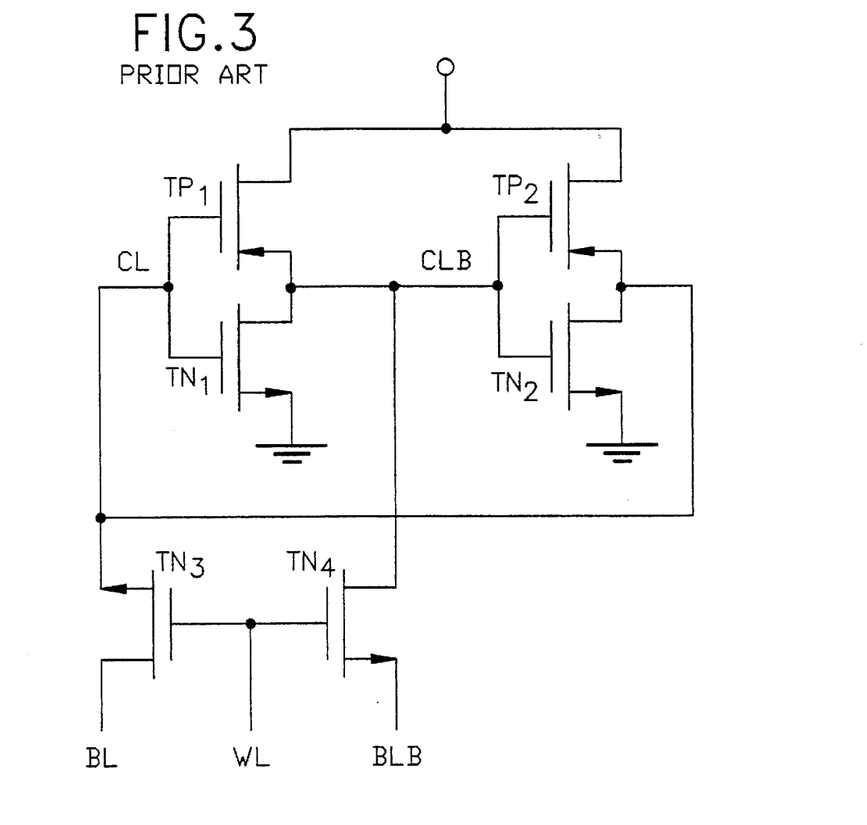
FIG. 3 is a diagram showing the structure of a conventional static memory.

As described above, static memory cells do not require a refresh operation. This is due to the structure and operating principle of a static memory cell such as that shown in FIG. 3. The operating principle is as follows: two inverter circuits are cross coupled. For example, if a CL terminal is at a high electric potential, and since a CLB terminal goes to a low electric potential such as ground, transistors $TN_1$ and $TP_2$ will be turned on, transistors $TN_2$ and $TP_1$ will be turned off. As a result, the voltage on the CL terminal is maintained high, so this state is stored as information. Since in such a static memory cell this state is maintained by a feedback latch, information will not be lost as long as power is not switched off. Therefore, a refresh operation such as a DRAM is not needed and an additional circuit such as a control clock also becomes unnecessary.

However, even though static memory cell has the above-described advantages, it has the disadvantage that the area occupied by the circuit is large. That is, a feedback circuit for maintaining the voltage levels of circuit terminals is required and a large number of elements for that circuit need to be used, so the chip area is increased. More specifically, while a DRAM is constituted by one capacitor and one transistor for selection, a static memory needs four transistors for a feedback circuit and two transistors for selection as long as it uses a CMOS circuit and therefore the area of a cell is very large. This disadvantage is critical in these days when the miniaturization of elements is desired.

A device element called a quantumdevice has been developed in recent years. The quantum device is one which uses the quantum-mechanical property of free electrons to perform information processing. Many of the quantum devices heretofore developed have an I-V characteristic such as the one shown in FIG. 4. By using the negative differential resistance of this quantum device (characteristic that I is reduced as V is increased), a positive feedback circuit can be constituted with a simpler structure such as that shown in FIG. 5.

2

Figure 4:
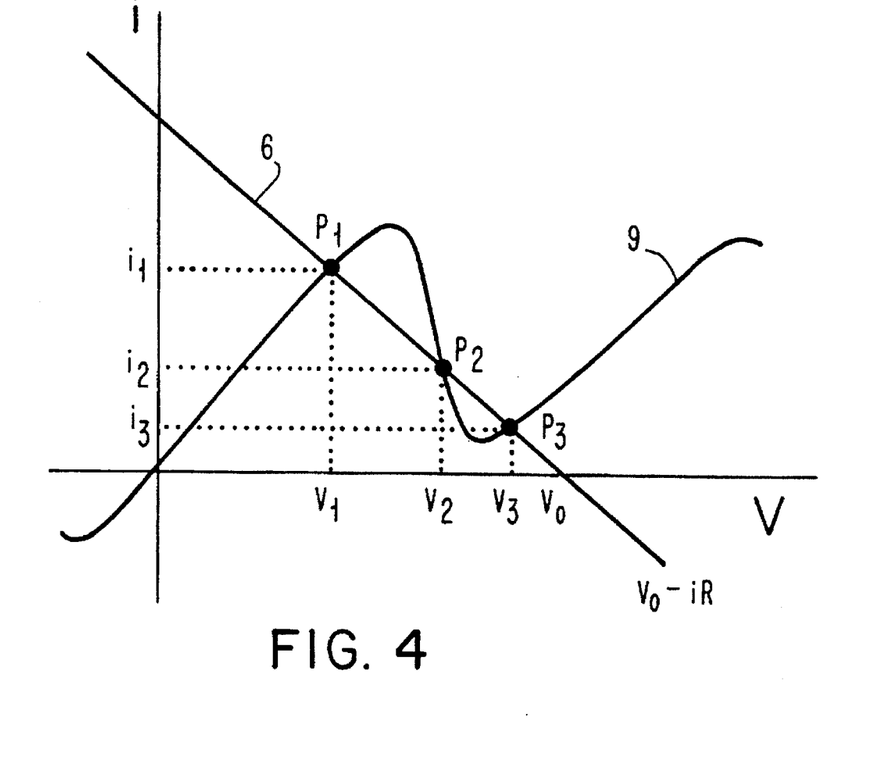
FIG. 4 is an I-V characteristic diagram of a quantum device.
Figure 5:
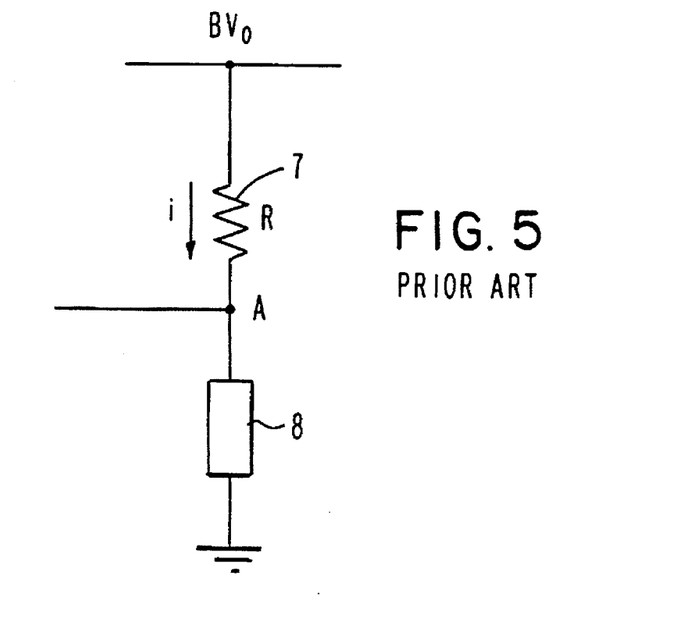
FIG. 5 is a diagram showing an example of a conventional quantum device.

The relationship between FIGS. 4 and 5 will hereinafter be described. FIG. 5 illustrates an example of a simple positive feedback using a quantum device, in which a quantum device 8 is connected in series to a resistor 7. The voltage on this connection point A can be represented by $(V_o-iR)$, when the voltage on a point B on the side of the resistor 7 opposite to the quantum device 8 is $V_b$. If the relationship between this voltage and current i is expressed in FIG. 4, it will become a straight line 6. This straight line is generally called a load line. In FIG. 4, the abscissa represents a voltage V and the ordinate represents a current i, and the point of intersection between the load line 6 and the abscissa is $V_o$. On the other hand, the voltage-current behavior of the quantum device 8 is shown by a curve 9 in FIG. 4. While the points of intersection $P_1$, $P_2$, and $P_3$ between the load line 6 and the curve 9 have been shown, the current i flowing through a resistor is aligned with the voltage-current behavior of the quantum device at the voltages and currents indicated by the points, and the positive feedback circuit shown in FIG. 5 is stabilized as one system.

That is, if two of $(i_1, V_1)$ according to the point $P_1$ of FIG. 4 and $(i_3, V_3)$ according to the point $P_3$ are considered, a system becomes stable at these two voltage-current conditions and exhibits a positive feedback circuit characteristic. Therefore, the point A of FIG. 5 can express a bit 0 or 1 in correspondence with the voltages $V_1$, $V_3$ according to these two points.

Since a positive feedback circuit using the conventional quantum device described above is stabilized at certain voltages $V_1$ and $V_3$, currents $i_1$ and $i_3$ corresponding to the voltages always flow in the stabilized state. A current that thus flows constantly in a stable state is called a standby current. If heat is generated by the standby current, there will be an important disadvantage that the degree of integration of a circuit is limited. That is, the memory cell using the conventional quantum device has the disadvantage of a standby current, because the circuit is not complementary.

To cope with the problems as produced by the prior art, the present invention proposes quite a new method of storing information and a new structure of a static memory.

It is an object of the present invention to provide a memory cell which is structurally simpler than memories being presently used.

It is another object of the present invention to provide a memory cell which has positive feedback.

Another object of the present invention is to provide a memory cell which has an area equivalent to the cell area of a DRAM and dispenses with a refresh operation.

Still another object of the present invention is to form a memory cell with a quantum device.

A further object of the present invention is to constitute the circuit complementarily and to greatly reduce the standby current.

SUMMARY OF THE INVENTION

The above objects of the present invention are achieved by a memory cell which comprises:

a plurality of insulating layers;

at least first, second and third conducting layers spaced apart by said insulating layers;

quantum-mechanical confinement of free electrons existing in each of said first, second and third conducting layers.

a first voltage application means for applying a predetermined voltage between first and third conducting layers of said at least three conducting layers, no tunneling current flowing directly between said first and third conducting layers; and a second voltage application means connected to a second conducting layer of said at least three conducting layers, a tunneling current being able to flow between said first and second conducting layers and between said second and third conducting layers.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENT

Figure 6A:
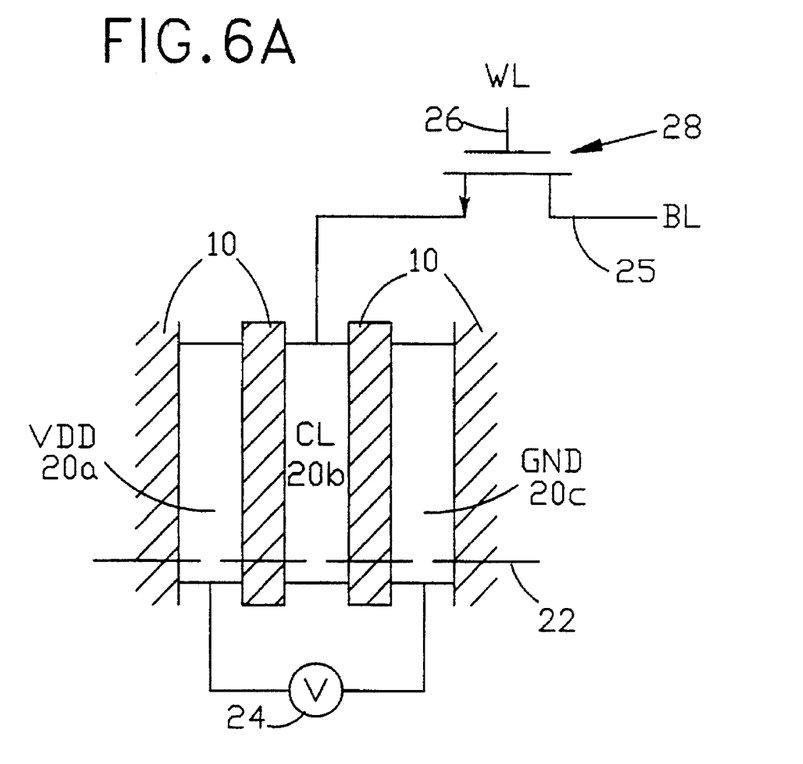
FIG. 6A is a diagram showing a memory cell according to the present invention.
Figure 6B:
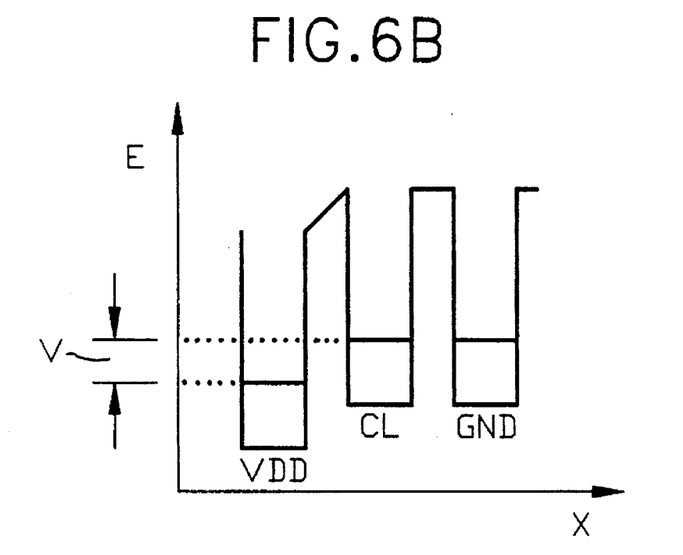
FIG. 6B is a graph of the energy level versus lateral distance through the memory cell shown in FIG. 6A.

Referring to FIGS. 6A and 6B, there is shown a preferred embodiment of a memory cell in accordance with the present invention. Three conducting layers 20a, 20b, and 20c are spaced apart with insulating layers 10. Reference line 22 is normal to layers 20a, 20b, 20c and 10 and is in the direction of the x-coordinate. Within the three conducting layers 20a, 20b, and 20c, the quantum-mechanical confinement of free electrons has been made. The quantum-mechanical confinement of free electrons used herein is intended to mean that since the motions of free electrons are limited to a very small area, they become in a state of having an energy level which is not continuous but discrete. The conducting layers are called VDD20a, CL20b, and GND 20c for the sake of convenience. And, between VDD20a and GND20c, a constant voltage is applied by a power supply 24. Also, another voltage is applied to CL 20b through a transistor 28 for selection by a bit line BL 25. This transistor 28 is controlled by a word line WL 26.

The present invention makes use of the phenomenon recently found by the inventor of this application and described in a publication: Y. Katayama, Ph.D. Thesis entitled "Transport studies in parallel two-dimensional electron gases", Princeton University, June 1994).

The phenomenon is that:

(a) When two conducting layers in which free electrons are quantum-mechanically confined in one dimensional direction and spaced apart with a thin insulating layer, (b) then if the quantum levels of these two conducting layers come close, a tunneling current flowing between these two conducting layers through the insulating layer will be greatly increased.

Each "conducting layer" used herein is referred to as a layer in which free electrons exist at its Fermi level and which, because of that, is in a state where electric conductivity is high. Also, each "insulating layer" used herein is referred to as a layer in which, since its Fermi level is located in a band gap, no free electrons exist at the Fermi level and which is in a state where electric conductivity is low. These layers can be estimated with their resistivity. For example, a conducting layer can be defined as having a resistivity of 1 ohm·cm or less, and an insulating layer can be defined as having a resistivity of 100 ohm·cm or more. However, the definition by resistivity of a conducting layer and insulating layer is an easier method and, physically, they should be discriminated by the above-described definition. In the present invention, what is normally called a semiconductor can also be thought of as a conducting layer, if it meets the definition described above.

The present invention makes use of the phenomenon according to the above-described (a) and (b), but this phenomenon is not well known and is very important for understanding the present invention. Therefore, before describing a preferred embodiment of the present invention in detail, the phenomenon on which the present invention is based will be described.

This phenomenon makes use of the physical phenomenon of tunneling between two-dimensional electron gases (2DEGs). The 2DEG is formed by quantum-mechanically confining free electrons in a certain one-dimensional direction. When this quantum-mechanical confinement is strong, the motion of a free electron will be stated as if it were two-dimensional motion. For example, in a MOS transistor, free electrons forming an inverted layer in a channel area are in this state.

This phenomenon is confirmed by measuring a tunneling current flowing between conducting layers in a GaAs-AlAs quantum well structure by a 4-terminal method. The outline of this discovery will hereinafter be stated.

Figure 7A:
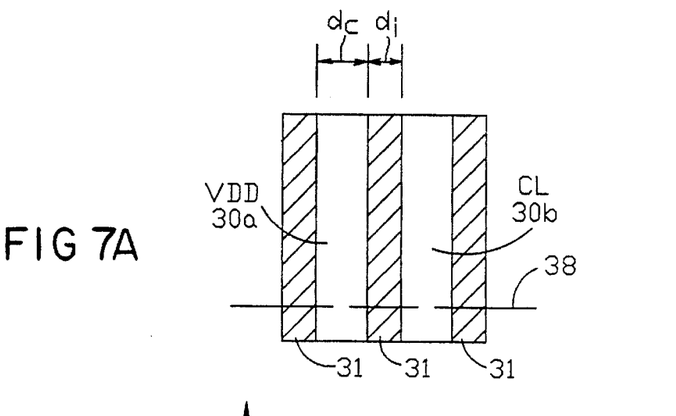
FIG. 7A is a diagram of a structure used to explain the principles of the present invention.

The 2DEG is realized, for example, when an extremely thin conducting layer is formed between insulating layers. As shown in FIG. 7A, the inventor employs two GaAs layers (30a, 30b) of a thickness of about 150 angstroms (Å) as a conducting layer and employ three AlAs layers 31 of a thickness of about 70 Å as insulating layers, and these layers are alternately stacked.

Figure 7B:
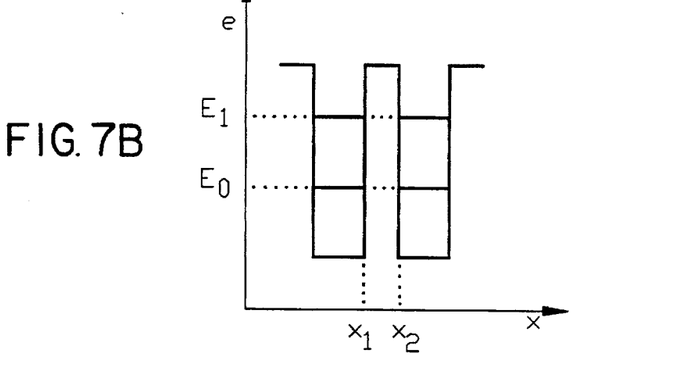
FIG. 7B is a graph of the energy level versus lateral distance through the memory cell shown in FIG. 7A.

The free electrons in these conducting layers are in a 2DEG state and form, quantum wells such as those shown in FIG. 7B. Now, the quantum wells are formed in the conducting layers 30a and 30b, respectively, and the two lowest quantum levels are assumed to be $E_1$ (higher energy) and $E_0$ (lower energy). Thus, in order to present a 2DEG state, the discontinuity needs to occur between the quantum levels by confining free electrons in a one-dimensional direction. And, for that, the thickness $d_c$ of the conducting layer needs to be sufficiently thin. The thickness $d_c$ of a conducting layer that presents a 2DEG state can be obtained by the following equations. First, the relationship between the thickness $d_c$ of the conducting layer and two lowest quantum levels $E_0$, $E_1$ is given by the following Eq. 1.

$$E_1 - E_0 = \frac{3h_o^2}{2m^*} \left( \frac{\pi}{d_c} \right)^2 \quad (1)$$

where $h_o$ is equal to Planck's constant h divided by 2n ($h_o = h/2n$), and $m^*$ represents the effective mass of a free electron.

Also, as a condition under which 2DEG is formed and the quantum-mechanical confinement of free electrons is made, $E_1 - E_0$ which is a difference between two quantum levels needs to satisfy the following Eq. 2.

$$\Gamma = h_o/\tau < E_1 - E_0 \quad (2)$$

That is, $E_1 - E_0$ which is a difference between two quantum levels has to be sufficiently greater than the vagueness of a quantum level by scattering, $\Gamma = h_o/\tau$ ($\tau$ is the average scattering time of a free electron). This is because if the vagueness of a quantum level by scattering becomes greater than this energy difference, two energy levels will be continuous and therefore a quantum well will not be formed.

If both Eqs. 1 and 2 are expanded with respect to the thickness $d_c$, then the following Eq. 3 will be obtained.

$$d_c \ll \frac{\pi}{\sqrt{\frac{2m^*}{3h_o\tau}}} \quad (3)$$

Therefore, the upper limit value of $d_c$ is determined with $m^*$ and $\tau$ as parameters.

Now, $m^*$ and $\tau$ are material-dependent parameters of a conducting layer substance, and $\tau$ also depends upon the temperature of the layer, the degree of smoothness of an interface between a conducting layer and an insulating layer, and the concentration of impurities in a conducting layer.

The thickness $d_c$ of a conducting layer is a precondition for carrying out the present invention. The free electrons in the conducting layer are confined in a one-dimensional direction, so in the present invention the thickness of a conducting layer should be determined according to this.

Next, in order to realize this phenomenon that the present invention uses, it is necessary that a sufficient tunneling current flows between the conducting layers 30a and 30b.

The magnitude of this tunneling current, i.e., the degree at which free electrons presenting the physical phenomenon of 2DEG are moved to the adjacent conducting layer by the tunnel phenomenon depends upon the thickness $d_1$ of an insulating layer defining the extent of the conducting layer. The tunneling current $I_t$ is expressed by the following Eq. 4.

$$I_t = \frac{2e^2 \rho t^2}{h_o \Gamma \left( 1 + \left( \frac{E_0^a - E_0^b}{\Gamma} \right)^2 \right)} \Delta V \quad (4)$$

where e represents the electric charge of an electron, $\Delta V$ represents the difference between the Fermi levels of 2DEG in adjacent conducting layers, $E_o^{\ a} - E_o^{\ b}$ is the energy difference between the two lowest quantum levels of adjacent conducting layers, and t represents a parameter that determines the probability of occurrence of a tunnel transition. Also, $\rho$ represents the density of states for the two-dimensional electron gas, and is expressed by $\rho = m^*/nh_o^{\ 2}$. It is understood from this equation that if the energy difference between the two lowest quantum levels of adjacent conducting layers, $E_o^{\ a} - E_o^{\ b}$, becomes smaller, a tunneling current $I_t$ per unit area will become much larger.

Also, the thickness $d_1$ of the insulating layer has the following relationship with t of Eq. 4.

$$t^2 = \frac{1}{4\pi^2 \rho_1^2} \left[ \exp \left( -2 \int_{x^1}^{x^2} \frac{\sqrt{2m^* \Delta \phi}}{h_o} dx \right) \right] \quad (5)$$

In Eq. 5, $x_1$ and $x_2$ represent the x-coordinate value normal to one interface of the insulating layer and the x-coordinate value normal to an interface of the insulating layer opposing to that one interface, as shown in FIGS. 7A, amd 7B and $d_i$ is equal to $x_2-x_1$. The x-coordinate is shown by reference line 38. Also, $\rho_1$ represents the density of states in a quantum-mechanical confinement direction, and $\Delta \Psi$ represents the tunnel barrier that a free electron feels. Among these, what depends on the kind and thickness of an insulating layer substance is $m^*$, $\rho_1$, and $\Delta \Psi$. Since this equation performs an integration from $x_1$ toward $x_2$, it cannot be expanded directly with respect to $d_i$. However, if this equation is employed, a person having ordinary skill in the art to which the invention pertains can easily calculate an appropriate insulating layer thickness that can achieve the operation of the present invention.

Figure 8:
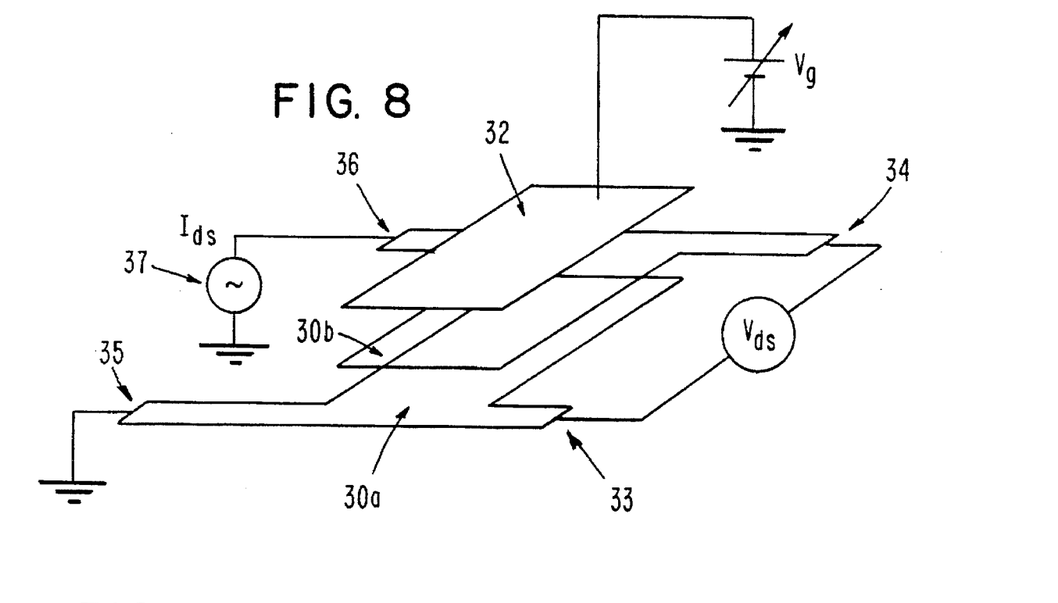
FIG. 8 is a schematic view showing an experimental circuit used to explain the principles of the present invention.

The inventor connects this stacked structure, as schematically shown in FIG. 8, and a tunneling current $i_t$ flowing between conducting layers was measured with $\Delta V_g$ as a parameter. $\Delta V_g$ is 0 when the quantum levels in the conducting layers 30a and 30b are the same, and represents the difference between that state (0) and an applied gate voltage. Note that while the conducting layers 30a and 30b has been shown in FIG. 8, the illustration of the insulating layer 31 is omitted. And, the conducting layer 30a is provided with terminals 33 and 35, the conducting layer 30b is provided with terminals 34 and 36, and a voltage $V_{ds}$ is applied between the terminals 33 and 34. The terminal 35 is connected to ground, the terminal 36 is connected to a current measurement device 37, and a current flowing between conducting layers is measured. A metal electrode 32 is provided for adjusting the difference between the quantum levels of two conducting layers 30a and 30b. That is, since the quantum level of the conducting layer 30b changes by applying a variable voltage Vg to the metal electrode 32, the difference of the quantum level with the conducting layer 30a can be varied. Thus, in a system in which electrons are quantum-mechanically confined, the quantum level and the Fermi level of the electron can be changed independently by changing the density of the free electron. In FIG. 8, $V_{ds}$ connected to the conducting layers 30a and 30b represents a voltage of the difference between the Fermi levels of the conducting layers 30a and 30b, and the voltage $V_g$ applied to an external metal gate 32 controls the quantum level. In measurements, $\Delta V_g$ is changed, and a change in a current value at that time, $i_r$, is obtained.

Figure 9:
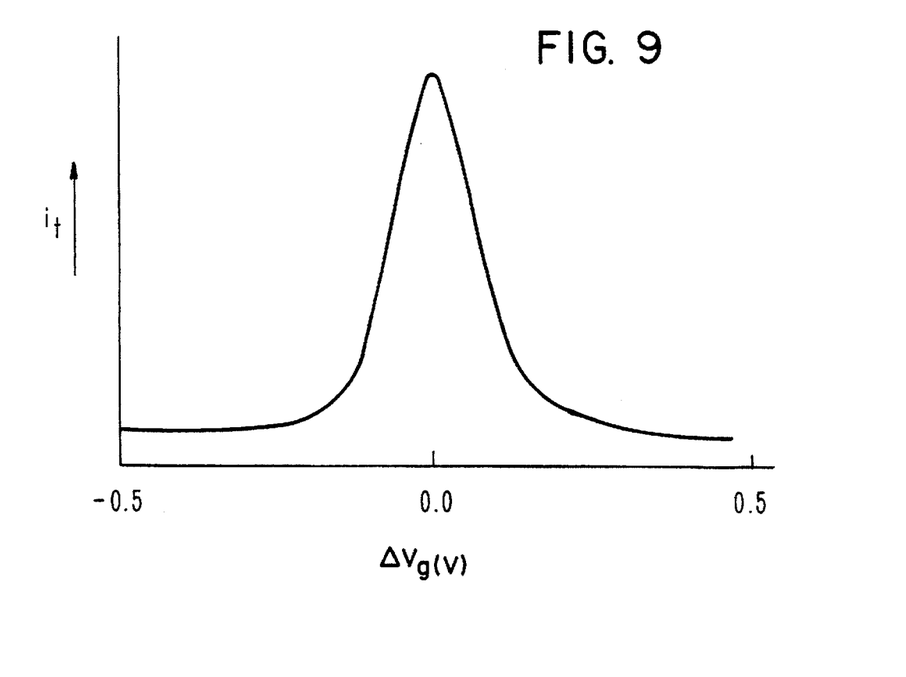
FIG. 9 is a graph showing the tunnel current versus a $\Delta Vg$ for explaining the present invention.

FIG. 9 shows this result. In the figure, the axis of the abscissa represents a voltage $\Delta V_g$ and the axis of ordinate represents a current i. When the difference of the quantum level is the same (i.e., $\Delta V_g=0$), there is the remarkable tendency that the maximum current flows. And, the conductivity at the peak value of this current is two digits (10) or more greater than the conductivity that is observed in a normal tunneling phenomenon. From this experiment, the inventors have found that (1) in a case where the physical phenomenon of 2DEG occurs and layers in which electrons are quantum-mechanically confined in one direction are adjacent through an insulating layer, (2) if the quantum levels of these adjacent layers come close, a very large current will flow as compared with a normal tunneling current or a value of resistance will become extremely small as compared with a normal tunneling resistance.

It is noted that in GaAs-AlAs system in which the inventors have confirmed the phenomenon described above, this phenomenon was confirmed at very low temperature. However, this is because the band gap of AlAs as an insulating layer is small and therefore the height of the barrier of a quantum well is insufficient, and is not an essential problem. That is, in a case where the barrier height of the quantum well is insufficient, since the value of the difference ($E_1-E_0$) between quantum levels of electrons by quantum confinement is not large. If the temperature becomes higher a width will occur in respective quantum levels and both levels will be continuous, so quantum confinement in a one-dimensional direction is broken. Therefore, with an insulating material where its band gap is large, such as $SiO_2$, the above-described phenomenon can be observed at high temperature, for example, room temperature.

The memory cell according to the present invention is again shown in FIG. 6A. As shown, the memory cell structure according to the present invention comprises three thin conducting layers VDD20a, CL20b, and GND20c spaced with thin insulating layers 10. And, the operation of the memory cell is realized by the structure in which a voltage difference V is applied to the opposite conducting layers, the voltage difference between the conducting layer VDD20a of the first quantum well and the conducting layer GND of the third quantum well is maintained to V, and a voltage is applied to the conducting layer CL20b of the second quantum well through the bit line 25. While it is most preferable that the parallel number of quantum wells be 3, a memory cell can be realized even with 4 or more parallel quantum wells. As shown in FIG. 6, three quantum wells are formed by adopting such structure, and quantum-mechanical confinement of free electrons are made in each quantum well, thereby forming a quantum level.

The thickness of each insulating layer and each conducting layer is preferable to be about 50 to 200 Å. However, the principle of the present invention is not limited to such thickness. The conducting layers described above may be within a range that meets the requirements of Eqs. (1), (2), and (3), and the insulating layers may be within a range that meets the requirements of Eqs. (4) and (5).

Figures 10, 11:
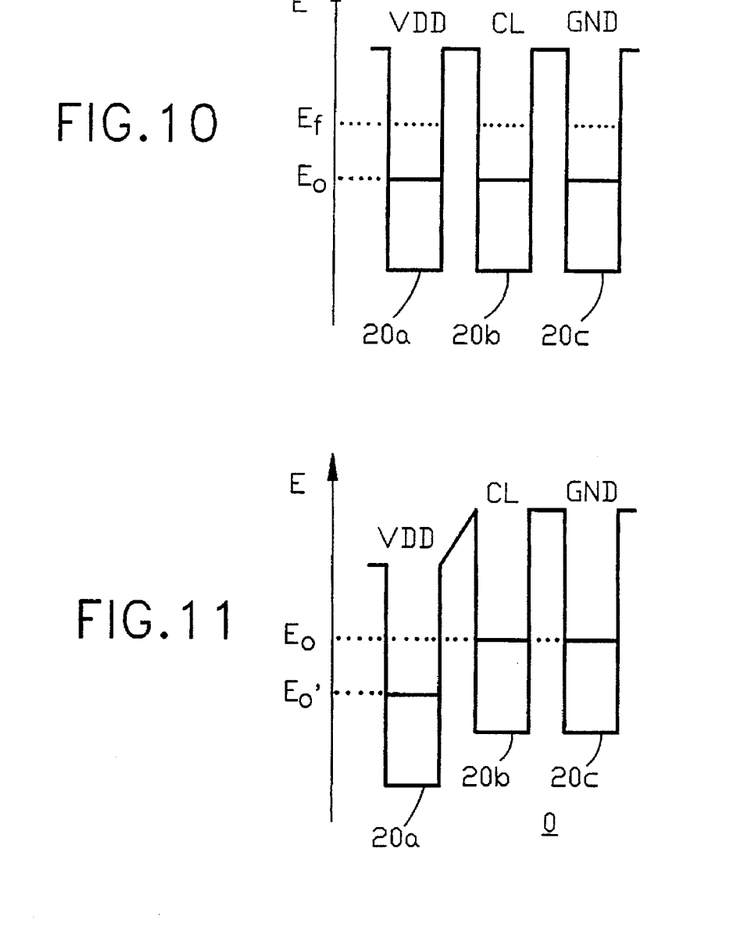
FIG. 10 is a graph showing the energy level versus lateral distance through the memory cell shown in FIG. 6A illustrating operation of the present invention.
FIG. 11 is a graph showing the energy level versus lateral distance through the memory cell shown in FIG. 6A illustrating the operation of the present invention.
Figure 12:
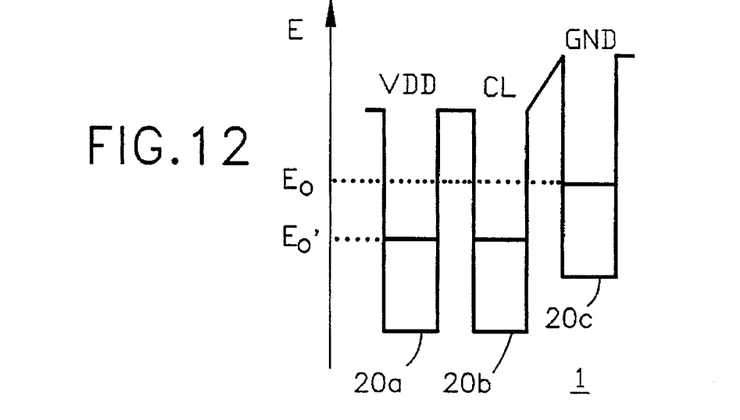
FIG. 12 is a graph showing the energy level versus lateral distance through the memory cell shown in FIG. 6A illustrating the operation of the present invention.

The operational principle of this structure will be described with reference to FIGS. 10 to 12. FIG. 10 shows the state in which a voltage has not been applied to the conducting layers VDD20a and GND20c of the opposite quantum wells. In this state a voltage difference has not occurred between the opposite conducting layers. It is now assumed that free electrons sufficiently exist in conducting layers and a Fermi level $E_f$ is above the lowest quantum level $E_0$ and below the next quantum level $E_1$. In this state, a tunneling phenomenon occurs between conducting layers because the insulating layers between the conducting layers are sufficiently thin, and a tunneling current flows between the conducting layers by the tunneling phenomenon.

Next, the state in which a voltage V has been applied to the opposite conducting layers VDD20a and GND20c of this system is shown in FIG. 11. If a normal system, the quantum level of the conducting layer CL20b in the second quantum well is to be maintained between $E_0$ and $E_{0'}$. However, in the structure according to the present invention, since the degree of freedom of free electrons has been reduced by the above-described 2DEG phenomenon, the quantum level of the conducting layer CL20b in the second quantum well is locked to the voltage of $E_0$ or $E_{0'}$. In FIG. 11 the voltage of the quantum level of CL20b has been locked to E0 equal to the voltage of the quantum level of the GND20c, and this corresponds to a "0" in a binary state. The reason that the voltage of the quantum level of CL20b in the second quantum well is locked to $E_0$ is that the tunneling current between the conducting layer CL20b according to the second quantum well and the conducting layer GND20c according to the third quantum well increases because the voltages of the quantum levels of the conducting layers CL20b and GND20c are close to each other and, on the other hand, the tunneling current between the conducting layer VDD20a according to the first quantum well and the conducting layer CL20b according to the second quantum well decreases because the voltages of the quantum levels of the conducting layers CL20b and VDD20a are away from each other. Note that a tunneling current and a voltage difference between quantum levels have been described in FIG. 9. As a result, the voltage of the conducting layer CL20b comes closer to the conducting layer GND20c, and the voltage of CL is locked to the voltage of GND.

Next, when the conducting layer CL20b is slightly transitioned to the side of the voltage of the conducting layer VDD20a, the voltage of the conducting layer CL20b and the voltage of the conducting layer GND20c are away from each other, so the tunneling current between the conducting layer CL20b and the conducting layer GND20c decreases, and instead, the voltage of the conducting layer CL20b and the voltage of the conducting layer VDD20a come close, so the tunneling current between the conducting layer CL20b and the conducting layer VDD20a increases. With this, the conducting layers CL20b and VDD20a are transitioned so that their voltages come close to each other. This state is shown in FIG. 12. And, this state corresponds to a "1" in a binary state.

Figure 13:
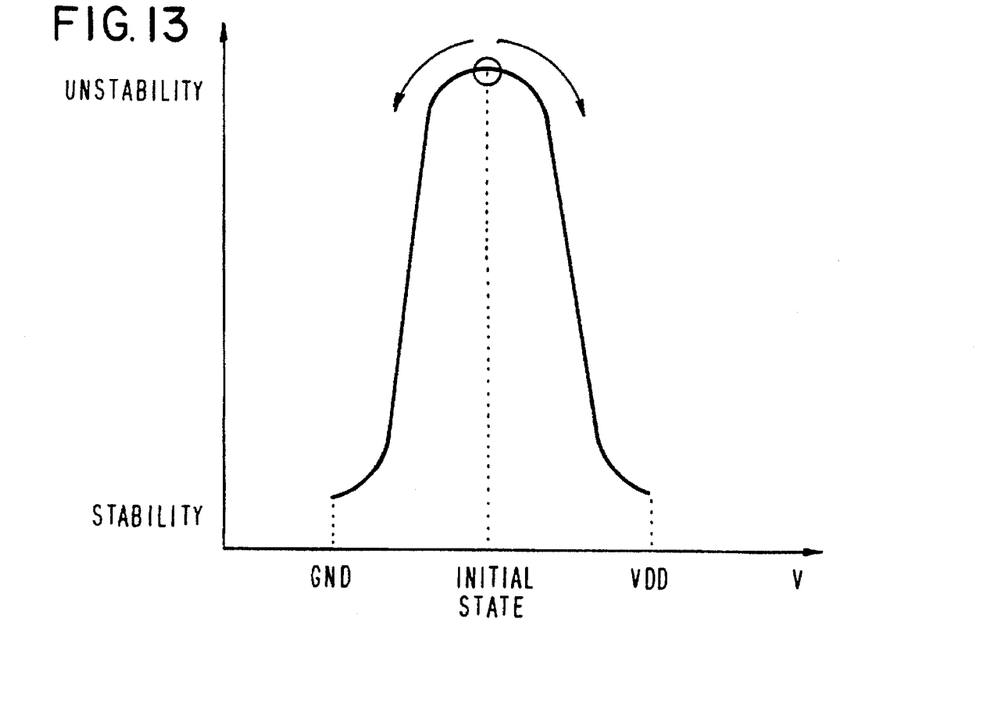
FIG. 13 is a diagram showing the positive feedback of the present invention.

The relationship between the voltage of the conducting layer CL operating as a memory cell of the present invention and the stability thereof is schematically shown in FIG. 13. From this figure it follows that in an initial state (FIG. 10) where the voltage of CL is between the voltages of VDD and GND, the voltage of CL is extremely unstable and, if this comes closer to either of VDD and GND, the voltage of CL will be stabilized. That is, in the initial state the voltage of the second conducting layer is in an extremely unstable state and is in a state of waiting application of a voltage either toward GND or VDD. And, if once this is applied, the voltage of CL will acceleratedly shift toward a stable state (GND voltage or VDD voltage). Because of this characteristic, the memory cell according to the present invention has positive feedback.

Next, the operations as reading and writing of information are performed with this memory cell will be described. In FIG. 6A, when information is read out of this memory cell, a FET 28 is turned on and the bit line 25 is driven with the positive feedback of the memory cell. Also, information writing can be performed by forcibly changing the voltage of CL by the bit line 25. If the FET 28 is turned off, the memory cell will be disconnected from an external circuit, and as long as an external supply voltage is applied, information will be maintained by the positive feedback.

Figure 14:
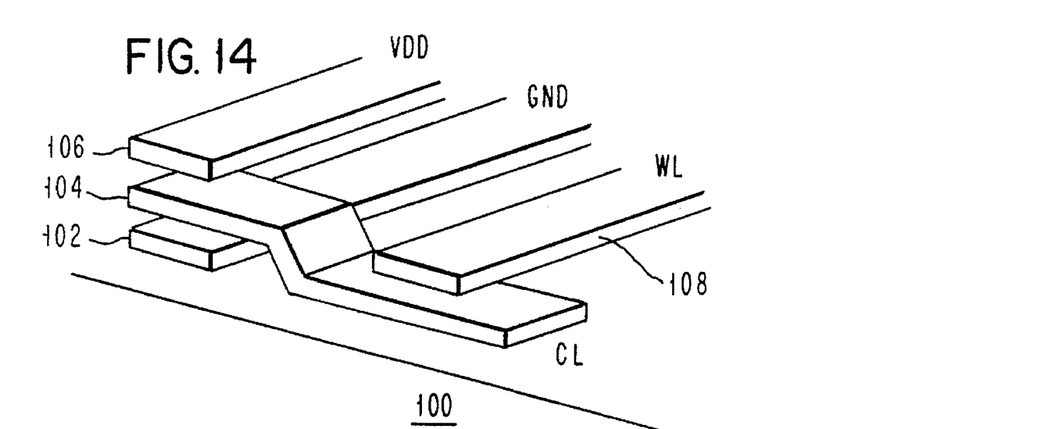
FIG. 14 is a perspective view showing a memory cell according to a first embodiment of the present invention.

Some examples of a structure actually using this three-layer structure are shown. FIG. 14 shows a structure in which single crystal silicon 100 is used as a substrate and layers comprising a metal, semiconductor or compound of a semiconductor such as Si and $SiO_2$ layers are laid on the substrate. In FIG. 14, conducting layers GND102, CL104, and VDD106 are formed from Si, and it is preferable that Si be single crystal silicon to reduce the scattering probability of free electrons. Also, a $SiO_2$ layer (not shown) which is an insulating layer is provided around these conducting layers GND102, CL104, and VDD106. Also, an electrode WL108 for a transistor for selection may be an arbitrary conductive material. In fabrication step, using the same material as a conducting layer is most advantageous.

What is important in the structure of the present invention is an interface between the metal, semiconductor or compound of a semiconductor, for example, Si and $SiO_2$. If this interface is not sufficiently smooth, the scattering probability of free electrons will become higher and therefore confinement of free electrons cannot be achieved. A chemical vapor deposition (CVD) technique can be considered as the first method of fabricating a smooth interface. However, in the CVD technique, when a thin film is formed, it becomes polycrystalline or amorphous, so there is the problem that the scattering probability of electrons within conducting layers is increased.

Also, as the second method of obtaining a smooth interface, there is a method in which oxygen ions are implanted into single crystal silicon, then annealing is performed at high temperature to maintain a single crystal state and also localize oxygen ions, and a Si layer and a $SiO_2$ layer are alternately formed. This method is used in a silicon-on-insulator (SOI) substrate, and it is possible to obtain a very smooth Si-$SiO_2$ interface (S. Nakajima, presented in JEIDA meeting on Silicon-On-Insulator, October 1994).

Figure 15:
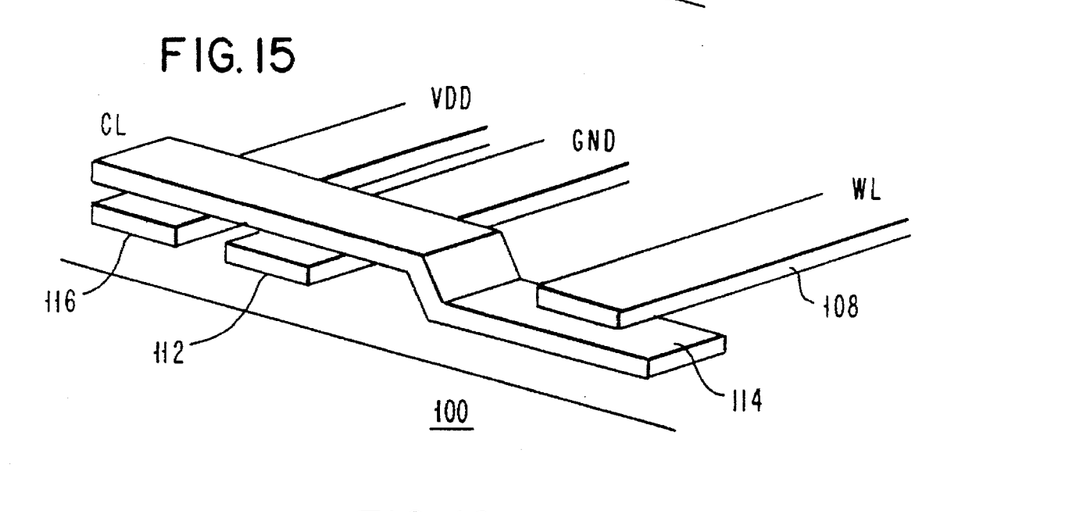
FIG. 15 is a perspective view showing a memory cell according to a second embodiment of the present invention.

FIG. 15 shows a structure which, even in a minor way, overcomes the difficulty of obtaining a smooth Si-$SiO_2$ interface. In this structure, conducting layers VDD116 and GND112 are formed under a conducting layer CL114, and with two layers, this structure is made so that it becomes equivalent to a three-layer structure. The arrangement of a single crystal silicon substrate 100 and an electrode WL108 for a transistor for selection is the same as the structure of FIG. 14.

Figure 16:
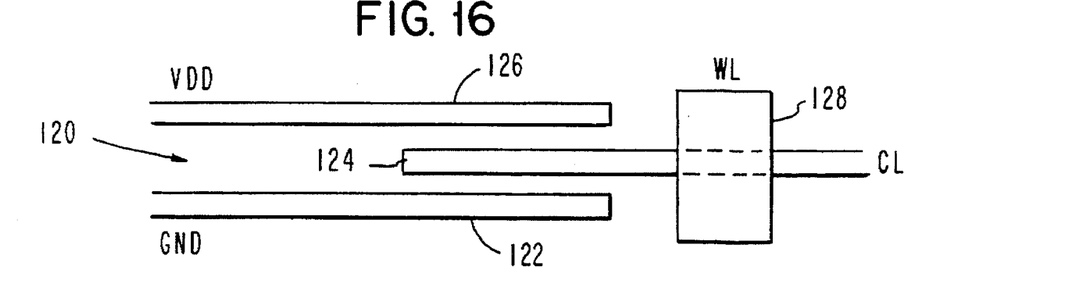
FIG. 16 is a plan view showing a memory cell according to a third embodiment of the present invention.

Further, a plane memory cell can also be formed, as shown in FIG. 16. In this memory cell, conducting layers are GND122, CL124, and VDD126, and an electrode WL128 for a transistor for selection is formed so that an insulating layer is interposed between the upper or lower portion of these conducting layers and the electrode WL128. Also, between conducting layers there is formed an insulating layer 120. A structure such as this can be formed with a very fine work technique such as an electron beam lithography system.

When Si-$SiO_2$ system is employed, the thickness of a conducting layer can be calculated with Eqs. (1), (2), and (3), and the thickness of an insulating layer can be calculated with Eqs. (4) and (5).

For example, the thickness $d_c$ of a Si layer which is a conducting layer can be calculated with Eqs. (1), (2), and (3), and an important parameter is the average scattering time of an free electron, $\tau$. $\tau$ is largely influenced by the smoothness of the interface between a conducting layer and an insulating layer as well as the kind of a conducting layer substance. If this is supposed from the degree of movement of an electron on a Si-$SiO_2$ obtained in a MOSFET, $\tau$ is about $7.4 \times 10^{-14}$ sec. The vagueness of an electron by scattering which is caused by this, $\Gamma$, is about 0.08 ev. This will satisfy Eq. (2) if it is assumed that the difference between two quantum levels of a conducting layer, $E_1-E_0$ is 0.1 eV. If these are premised on and Eq. (3) is calculated by substituting the effective mass of a free electron, m*=0.26 m, the thickness $d_c$ will be less than about 60 Å. However, since this value is largely influenced by $\tau$ which is influenced by the smoothness of a Si-$SiO_2$ interface, the thickness $d_c$ may be a little thicker if smoothness can further be enhanced. In GaAs-AlAs system the interface can actually be smoothed sufficiently. Therefore, particularly at low temperature, one-dimensional confinement of free electrons is possible even in a further thick layer (for example, 100 to 200 Å). However, as $d_c$ becomes thicker, the smoothness on an interface needs to be enhanced to achieve one-dimensional confinement of free electrons, or the structure itself becomes larger and cannot meet the demand of the present invention for miniaturizing a memory cell, so it is preferable that $d_c$ be 1000 Å or less.

Also, the thickness of a $SiO_2$ which is an insulating layer can be calculated from Eqs. (4) and (5), but the thickness can be extrapolated from experimental results of other materials such as GaAs. From this, a thickness of about 20 to 30 Å will be an optimum value as long as $SiO_2$ is selected as an insulating layer. For insulating layers, it is a condition that a tunneling current flows sufficiently, so if within that condition, there is no need of limiting a thickness. It has been found that in GaAs-AlAs system, even 70 Å or so is sufficient. A tunneling current value (per unit area) that should flow, $I_t$, can be calculated by $I_t=CV/\tau$ where C represents the capacitance between conducting layers, $\tau$ represents a time for charging the capacitance, and V is the voltage applied to the capacitance. For example, if $C=10^{-7}$ F/cm², V=1V, and $\tau=10^{-31.9}$ sec, $I_t$ is about 100 Å/cm². Thus, $I_t$ depends on how fast a memory cell is operated, so it is not determined physically but is a matter of design. However, since the access speed of a current DRAM is about $7\times10^{-8}$ sec, setting $I_t$ to less than 1 Å/cm² lacks actuality. Therefore, it is practical that the thickness of an insulating layer is determined within this range. Also, if the thickness of an insulating layer becomes too thick, the structure itself will become large and will not meet the demand of the present invention for miniaturizing a memory cell. Therefore, in view of this demand, it is preferable that the thickness of the insulating layer be 500 Å or less.

The possibility of realization of the memory cell proposed by the present invention will be verified with a simulation model. As this verification, (1) there is shown a circuit (unit circuit) equivalent to the above-described structure having a 2-parallel quantum wells, (2) an equivalent circuit of a memory cell having a 3 parallel quantum well according to the present invention is formed by combining the unit circuits, and (3) the results obtained as a characteristic as a memory cell is simulated with the equivalent circuit will be described. That is, the equivalence between the 2 parallel quantum well structure and the unit circuit is verified by (1). The equivalence between the equivalent circuit comprising a combination of unit circuits and the memory cell using a 3 parallel quantum well according to the present invention is verified by (2). It is verified by (3) that the equivalent circuit exhibits the characteristic or positive feedback of the memory cell.

The above-described (1) is disclosed in "Lumped Circuit Model of Two-Dimensional to Two-Dimensional tunneling transistor, Y. Katayama, D.C. Tsui, Appl. Phys. Lett 62(20), May 17, 1993." The outline of the contents of this literature will hereinafter be described.

Figure 17:
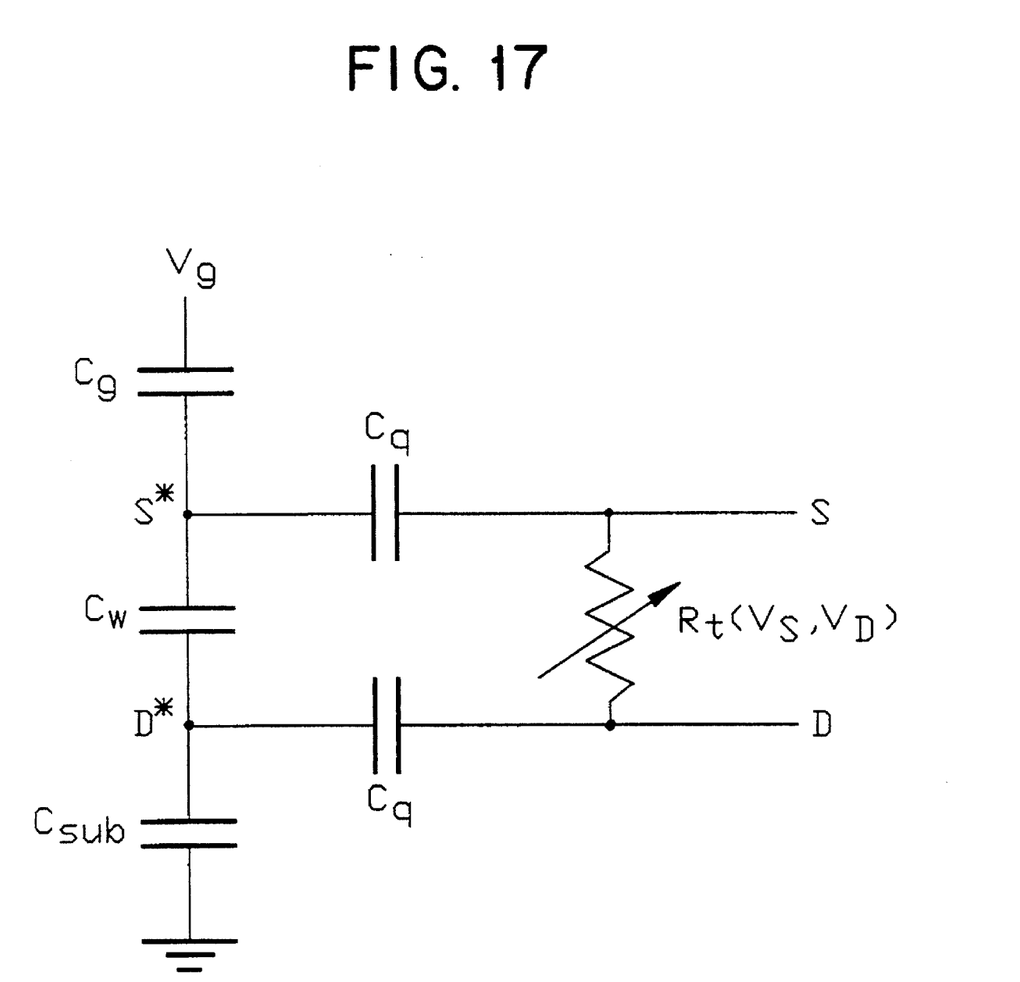
FIG. 17 is a diagram showing a simulation circuit for verifying the operation of the principles of the present invention.

According to this, the equivalent circuit (unit circuit described above) of a 2 parallel quantum wells is shown in FIG. 17. In the unit circuit, two quantum levels correspond to the voltages on the points indicated by node S* and node D*. This unit circuit, as compared with the equivalent circuit of a conventional transistor, is characterized in that S and D representative of a Fermi level are separated by S* and D* representative of a quantum level and by a capacitance $C_q$. This capacitance $C_q$ represents a quantum capacitance (for Cq, see "S. Luryi, Appl. Phys. Lett. 52, 501 (1988)"). Also, $C_w$ corresponds to a capacitance that an adjacent conducting layer forms, and $R_t$ is a resistance as a tunneling current flows. This $R_t$ is equivalent to $\Delta V/I_t$ which is a modification of Eq. (4).

Figure 18A:
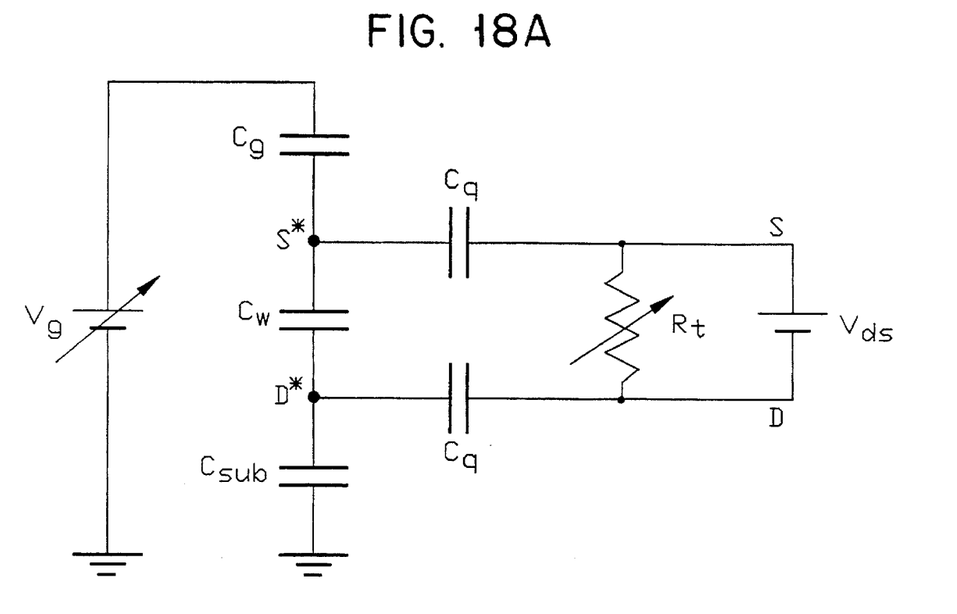
FIG. 18A is a diagram showing a simulation circuit for verifying the operation of the principles of the present invention.
Figure 18B:
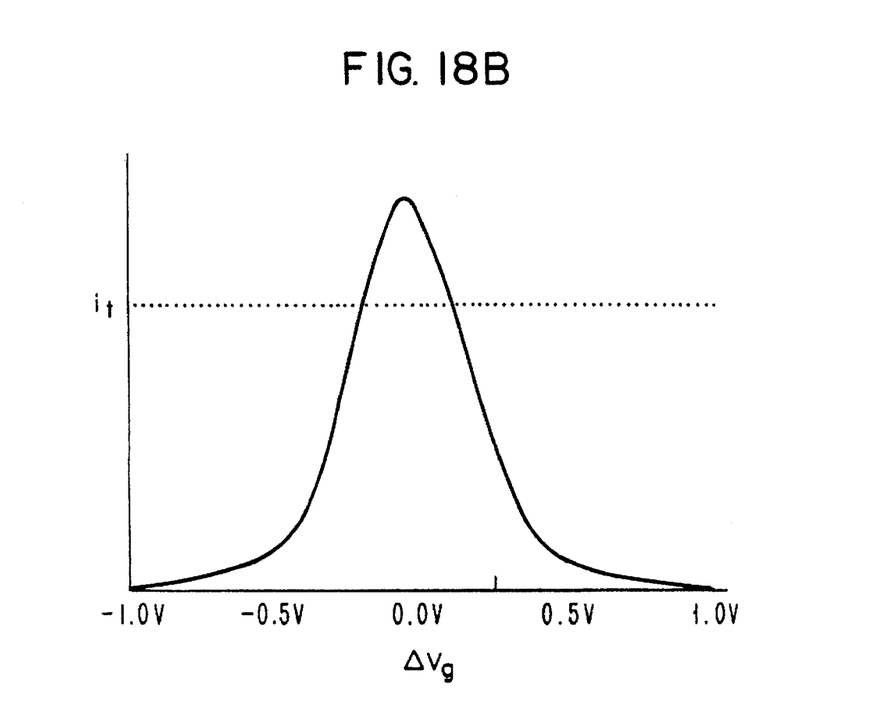
FIG. 18B is a graph showing the tunnel current versus a $\Delta Vg$ showing the results obtained from the simulation circuit of FIG. 18A.

As shown in FIG. 18A, in the unit circuit, a constant voltage $V_{ds}$ is applied between nodes S and D and a variable voltage $v_g$ is applied. The variable voltage $V_g$ serves as controlling the voltage difference between S* and D*, $E_o{}^a$–$E_o{}^b$. The voltage-current behavior as the terminal on the side of $C_{sub}$ is connected to ground and the variable voltage $V_g$ is transitioned, is shown in FIG. 18B. In FIG. 18A, the axis of the abscissa represents a voltage $\Delta V_g$ and the axis of the ordinate represents an observed current value. This behavior accurately corresponds to the behavior of the tunneling current of FIG. 9 of the structure having 2 parallel quantum wells. Therefore, it follows that the unit circuit shown in FIG. 17 is formed as an equivalent circuit representative of the voltage-current behavior of a structure having a 2 parallel quantum well. With this, the equivalence between the 2 parallel quantum well structure and the unit circuit, stated in (1), can be verified.

Figure 19:
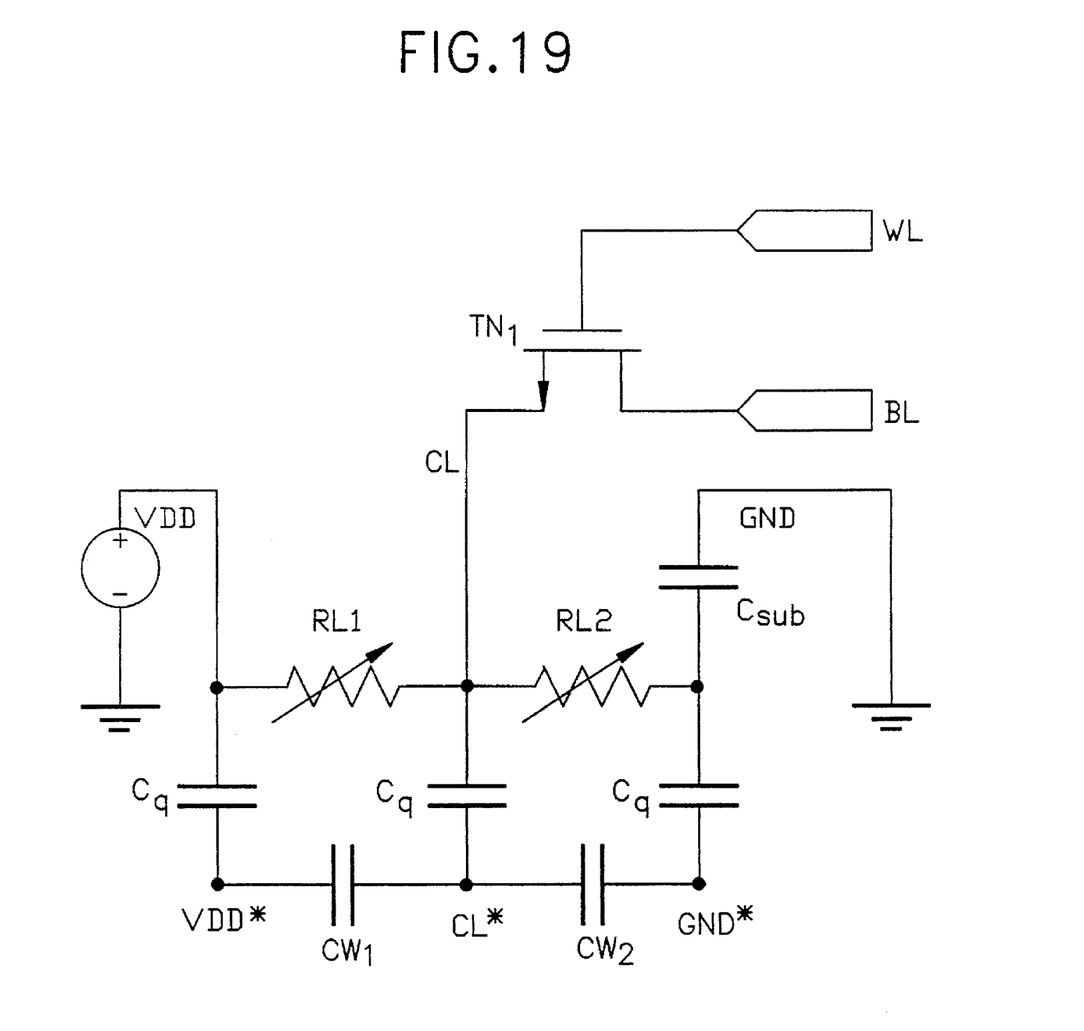
FIG. 19 is a diagram showing a circuit for simulating a memory cell of the present invention.

Next, the equivalence between an equivalent circuit of a memory cell of the present invention comprising a combination of unit circuits and an actual 3 parallel quantum well structure, stated in (2), will be described. If it is assumed that a unit circuit is equivalent to a 2 parallel quantum well structure, a 3 parallel quantum well structure will be equal to a structure in which two unit circuits representative of a 2 parallel quantum well structure are arranged, as shown in FIG. 19. In the figure, $Cw_1$ corresponds to the capacitance between conducting layers VDD and CL, and $Cw_2$ corresponds to the capacitance between conducting layers CL and GND. $Rt_1$ corresponds to the tunneling resistance between conducting layers VDD and CL, and $Rt_2$ corresponds to the tunneling resistance between conducting layers CL and GND. Therefore, it is understood that a circuit (FIG. 19) in which two unit circuits are coupled at node CL* is an equivalent of a 3 parallel quantum well structure such as that shown in FIG. 6. Now, when the circuit of FIG. 19 is compared with the unit circuit according to FIG. 17, $C_g$ is removed. In the unit circuit the $C_g$ is needed because a gate voltage is applied based on the object of the experiment, while in the equivalent circuit the $C_g$ is not needed because a gate voltage is not applied. Therefore, even if $C_g$ is not shown, the equivalence between circuits will not be lost.

Also, the equivalent circuit of FIG. 19 includes a word line (WL), a bit line (BL), and a FET ($TN_1$) for memory cell selection, to verify the operation of the memory cell. From this structure it will be understood that this equivalent circuit is equivalent to a memory cell which requires a 3 parallel quantum well structure of the present invention. With this, an equivalent circuit of the memory cell of the present invention can be formed, as stated in the above-described (2).

Figure 20:
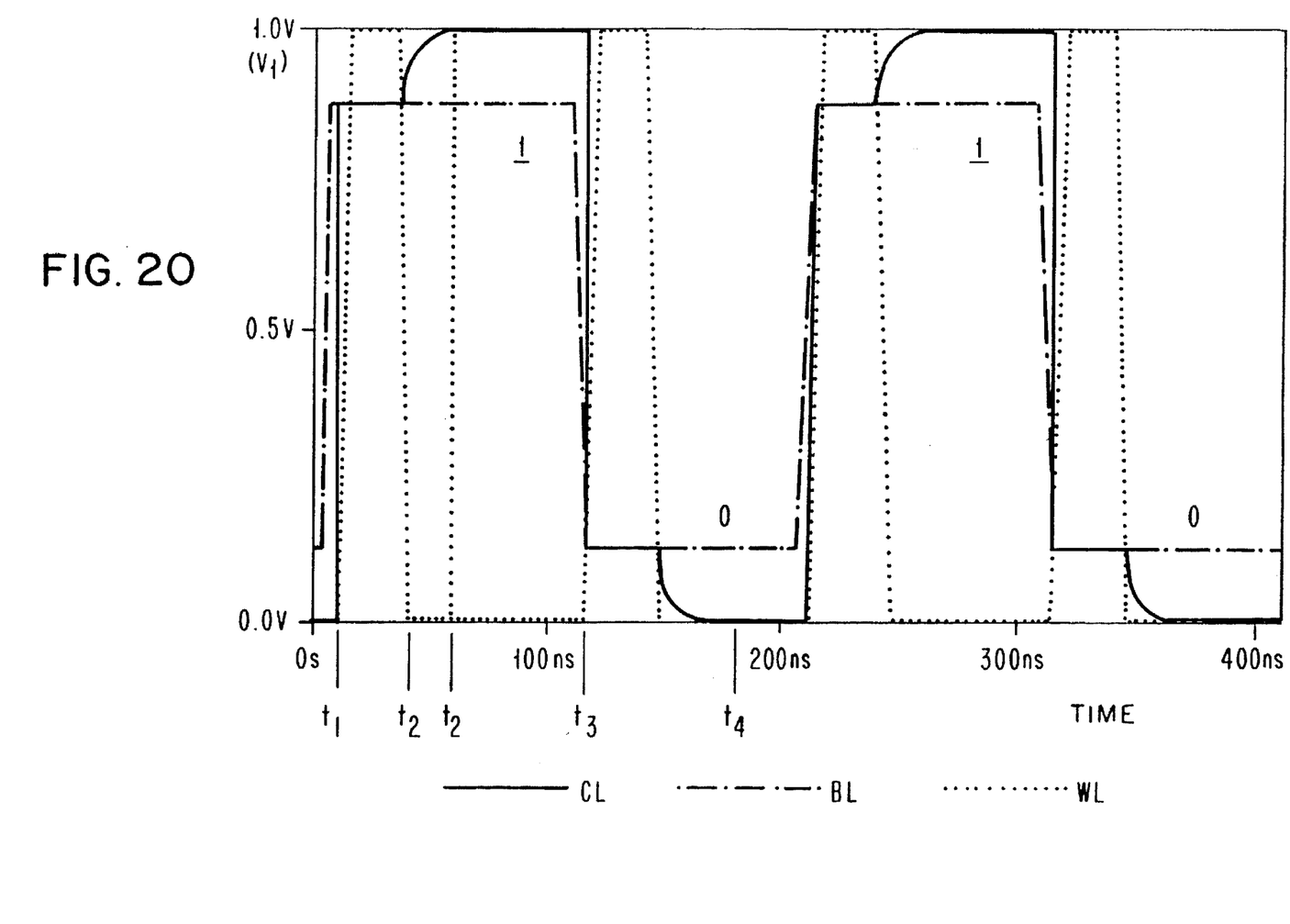
FIG. 20 is a graph showing results obtained by the circuit for simulating a memory cell of the present invention.

Finally, it will be described that, as stated in (3), this equivalent circuit has a characteristic as a memory cell. The voltage-current behavior of this equivalent circuit is shown in FIG. 20. A memory cell according to the present invention is simulated by an equivalent circuit. In FIG. 20, there is shown the behavior of CL as BL changes according to 1=>0=>1=>0. Since WL performs a bias operation for switching (FIG. 6A), $TN_1$ shown in FIG. 19 is turned on when WL is high, so the voltage of CL becomes equal to the voltage of BL. And, since $TN_1$ is turned off when WL goes to low, if it is assumed that the memory cell of the present invention has positive feedback, the voltage of CL will continue to transition toward a certain stable voltage and, finally, it is to be held in a stable voltage state.

The foregoing description is exactly verified by the results of the simulation. That is, if BL is in a high state between $t_1$ and $t_3$ and WL is turned on between $t_1$ and $t_2$, CL will indicate $V_1$ after a slight transition time. At this time, the voltage of CL continues to rise even after WL is turned off ($t_2$), and finally, the voltage of CL is stabilized at $t_2'$. It is a verification of positive feedback that the transition of CL toward a stable state continues after $TN_1$ is turned off. Therefore, it is understood that the equivalent circuit has the characteristic of a memory cell, as stated in (3), and particularly, it has positive feedback which is the characteristic of a static memory. From the verification of (1), (2), and (3), the realization of the present invention can be verified.

And, from the standpoint of the quantum behavior of electrons, this characteristic is based on a phenomenon in which:

(a) When two conducting layers in which free electrons have quantum-mechanically been confined in a one-dimensional direction are spaced with a thin insulating layer, (b) If the quantum levels of the two conducting layers come close, a tunneling current flowing between the conducting layers through the insulating layer will be greatly increased.

That is, since this phenomenon is used, when the energy level of the second quantum well moves toward the level of the first or third quantum well having an energy level close to that energy level, a tunneling current between the second quantum well and the quantum well having an energy level close to the second quantum well increases greatly, so the energy level of the second quantum well moves in the direction where the voltage difference between two quantum wells is reduced, and is stabilized. This is the reason why the present invention can obtain positive feedback.

The present invention is a memory cell with positive feedback. Therefore, it is unnecessary to perform a refresh operation. Also, the essential part of the present invention is constituted with only three conducting layers spaced with insulating layers, so the present invention has a structure simpler than static memories being presently used. An area that this structure occupies depends on a design, but it is substantially equal to the cell area of a DRAM. The present invention forms a memory cell with a quantum device, and since the circuit is complementary, a standby current can greatly be reduced.

Having thus described our invention, what we claim as new and desire to secure by Letters Patent is:

1. A memory cell comprising:
a plurality of insulating layers;
at least first, second and third conducting layers spaced apart by said insulating layers;
a first voltage application means for applying a predetermined voltage between first and third conducting layers of said at least three conducting layers, no tunneling current flowing directly between said first and third conducting layers; and
a second voltage application means connected to a second conducting layer of said at least three conducting layers, a tunneling current being able to flow between said first and second conducting layers and between said second and third conducting layers;
quantum-mechanical confinement of free electrons existing in each of said at least said first, second and third conducting layers.

2. The memory cell as set forth in claim 1, wherein said second voltage application means includes an interrupting switch.

3. The memory cell as set forth in claim 1, wherein information is stored in correspondence with the potential of said second conducting layer that is controlled by said second voltage application means.

4. The memory cell as set forth in claim 1, wherein said second voltage application means applies two predetermined voltages to said second conducting layer.

5. A memory cell comprising:
a plurality of insulating layers;
at least first, second and third conducting layers spaced apart by said insulating layers;
a first voltage application means for applying a predetermined voltage between first and third conducting layers of said at least three conducting layers, no tunneling current flowing directly between said first and third conducting layers; and
a second voltage application means connected to a second conducting layer of said at least three conducting layers, a tunneling current being able to flow between said first and second conducting layers and between said second and third conducting layers;
wherein quantum-mechanical confinement of free electrons exists in each of said at least said first, second and third conducting layers; and wherein the voltage of said second conducting layer becomes stable at the voltage of said first conducting layer or the voltage of said third conducting layer, and has positive feedback.

6. A memory cell comprising:
a plurality of insulating layers;
at least first, second and third conducting layers spaced apart by said insulating layers;
a first voltage application means for applying a predetermined voltage between first and third conducting layers of said at least three conducting layers, no tunneling current flowing directly between said first and third conducting layers; and a second voltage application means connected to a second conducting layer of said at least three conducting layers, a tunneling current being able to flow between said first and second conducting layers and between said second and third conducting layers;
wherein quantum-mechanical confinement of free electrons exists in each of said at least said first, second and third conducting layers; and
wherein a thickness of said conducting layers, $d_c$, is given by equation (1), $$d_c \ll \frac{\pi}{\sqrt{\frac{2m^*}{3h_o\tau}}} \qquad [\text{Eq. 1}]$$

where $h_o$ is equal to Planck's constant h divided by $2\pi$ ($h_o=23$ h/$2\pi$), $m^*$ represents the effective mass of a free electron, and $\tau$ represents the average scattering time of a free electron.

7. The memory cell as set forth in claim 1, wherein a thickness of said conducting layers, $d_c$, is 1000 Å or less.

8. A memory cell comprising:
a plurality of insulating layers;
at least first, second and third conducting layers spaced apart by said insulating layers;
a first voltage application means for applying a predetermined voltage between first and third conducting layers of said at least three conducting layers, no tunneling current flowing directly between said first and third conducting layers; and
a second voltage application means connected to a second conducting layer of said at least three conducting , a tunneling current being able to flow between said first and second conducting layers and between said second and third conducting layers;
wherein quantum-mechanical confinement of free electrons exists in each of said at least said first, second and third conducting layers; and wherein a thickness of said insulating layers, $d_1$, includes a range that can be determined according to $d_1=x_2-x_1$ as the maximum obtained by equation (2) and equation (3), It, is greater than or equal to 1 A/cm², said equations (2) and (3) being given by $$I_t = \frac{2e^2\rho t^2}{h_o\Gamma\left(1+\left(\frac{E_0^a - E_0^b}{\Gamma}\right)^2\right)} \Delta V \qquad [\text{Eq. 2}]$$

$$t^2 = \frac{1}{4\pi^2\rho_1^2}\left[\exp\left(-2\int_{x^1}^{x^2} \frac{\sqrt{2m^*\Delta\phi}}{h_o} dx\right)\right] \qquad [\text{Eq. 3}]$$

where $I_t$ represents the value of a tunneling current per unit area flowing through the insulating layer, e represents the electric charge of an electron, $\Delta V$ represents the difference between the Fermi levels of the two-dimensional electron gas states of adjacent conducting layers, $E_o^a - E_o^b$ is the energy difference of the lower quantum level of adjacent conducting layers, t represents a parameter that determines the probability of occurrence of tunnel transition, ρ represents the state density of two-dimensional electron gas (ρ=m*/nh$_o$2), x1 and x2 represent the x-coordinate value normal to one interface of the insulating layer and the x-coordinate value normal to an interface opposing to that one interface, $\rho_1$ represents the state density of an electron in a quantum-mechanical confinement direction, Δ105 represents the tunnel barrier that a free electron feels, ho is equal to Planck's constant h divided by $2\pi$ ($h_o$=h/$2\pi$), and Γ represents the vagueness of a quantum level by scattering.

9. The memory cell as set forth in claim 1, wherein a thickness of said insulating layers, dr, is 500 Å or less.

10. The memory cell as set forth in claim 1, wherein said conducting layers comprise silicon (Si) and said insulating layers comprise silicon oxide ($SiO_2$).

11. The memory cell as set forth in claim 1, wherein the resistivity of said conducting layers is 1 ohm-cm or less.

12. The memory cell as set forth in claim 1, wherein free electrons exist in the Fermi level of said conducting layers.

13. The memory cell as set forth in claim 1, wherein the resistivity of said insulating layers is at least 100 ohm-cm or more.

14. The memory cell as set forth in claim 1, wherein no free electrons exist in the Fermi level of said insulating layers.

* * * * *